United States Patent [19]

Nowak

[11] Patent Number: 5,396,454
[45] Date of Patent: Mar. 7, 1995

[54] STATIC RANDOM ACCESS MEMORY CELL UTILIZING A GATED DIODE LOAD ELEMENT

[75] Inventor: Edward D. Nowak, Pleasanton, Calif.

[73] Assignee: VLSI Technology, Inc., San Jose, Calif.

[21] Appl. No.: 126,462

[22] Filed: Sep. 24, 1993

[51] Int. Cl.$^6$ ............................................. G11C 11/40
[52] U.S. Cl. ................................... 365/154; 257/367; 257/903; 257/904; 365/156; 365/190
[58] Field of Search ............... 365/154, 156, 190, 201; 257/903, 904, 367

[56] References Cited

U.S. PATENT DOCUMENTS 5,046,044 9/1991 Houston et al. ..................... 365/156

OTHER PUBLICATIONS

T. Ohzone, T. Hirao, K. Tsuji, S. Horiuchi, and S. Takayanagi, *A 2K× 8-Bit Static MOS RAM with a New Memory Cell Structure*, IEEE J. Solid-State Circuits, vol. SC-15, Apr. 1980, pp. 201-205.

N. Okazaki, T. Komatsu, N. Hoshi, K. Tsuboi and T. Shimada, *A 16ns 2K × 8 Bit Full CMOS SRAM*, IEEE Journal of Solid-State Circuits vol. SC-10, No. 5, Oct. 1984, pp. 552-556.

T. Y. Chan, J. Chen, P. K. Ko and C. Hu, *The Impact of Gate-Induced Drain Leakage Current on MOSFET Scaling*, Digest of IEDM, 1987, pp. 718-721.

T. Endoh, et al., *An Accurate Model of Subbreakdown Due to Band-to-Band Tunneling and Some Applications,* IEEE Transactions on Electron Devices, vol. 37, No. 1, Jan. 1990, pp. 290-295.

*Primary Examiner*—Eugene R. LaRoche
*Assistant Examiner*—Christopher R. Glembocki
*Attorney, Agent, or Firm*—Douglas L. Weller

[57] ABSTRACT

A memory cell includes gated diodes as load elements. For example, the memory cell includes a word line, a bit line, an inverted bit line, a ground line, a power line, a first transistor, a second transistor, a third transistor, a fourth transistor, a first gated diode and a second gated diode. The first transistor has a first end connected to the inverted bit line, a second end, and a gate connected to the word line. The second transistor has a first end, a second end connected to the bit line, and a gate connected to the word line. The third transistor has a first end connected to the second end of the first transistor, a second end connected to the ground line, and a gate connected to the first end of the second transistor. The fourth transistor has a first end connected to the first end of the second transistor, a second end connected to the ground line, and a gate connected to the second end of the first transistor. The first gated diode includes a first end connected to the power line and a second end connected to the second end of the first transistor. The second gated diode includes a first end connected to the power line and a second end connected to the first end of the second transistor.

16 Claims, 3 Drawing Sheets

STATIC RANDOM ACCESS MEMORY CELL UTILIZING A GATED DIODE LOAD ELEMENT

BACKGROUND

This invention relates generally to static random access memory (SRAM) cells and particularly to SRAM cells which utilize gated diode load elements.

Presently, using complementary metal oxide silicon (CMOS) technology, SRAM cells are constructed using either a four transistor or a six transistor implementation. Typically, the four transistor configuration uses a polysilicon load element which functions as a passive resistor. See, for example, T. Ohzone, T. Hirao, K. Tsuji, S. Horiuchi, and S. Takayanagi, A 2K×8-Bit Static MOS RAM with a New Memory Cell Structure, *IEEE J. Solid-State Circuits*, vol. SC-15, April 1980, pp. 201-205. The six transistor configuration typically uses p-channel transistors as active load elements. The p-channel transistors used as active load elements may be conventional transistors or thin film transistors. The thin film transistors are built in silicon film deposited over the memory cell, similar to a polysilicon load resistor. See for example, N. Okazaki, T. Komatsu, N. Hoshi, K. Tsuboi and T. Shimada, A 16 ns 2K×8 Bit Full CMOS SRAM, *IEEE Journal of Solid-State Circuits*, Volume SC-10, No. 5, October 1984, pp. 552-556.

The four transistor configuration has the advantage of a smaller size. The four transistor configuration has the disadvantage of requiring a more complex process which is not easily implemented in application specific integrated circuit (ASIC) processes (or process flows). The four transistor configuration also has the disadvantage that it results in higher standby currents.

The six transistor configuration has the advantage that it can be implemented in the standard ASIC CMOS process. However, SRAM cells which utilize the six transistor configuration are larger than SRAM cells which utilize the four transistor configuration and are more susceptible to latch up. Latch up occurs when the four-layer NPNP CMOS structure acts like a silicon controlled rectifier (SCR) and switches from a high impedance state to a low impedance state in response to a triggering signal. This latch up is detrimental and sometimes destructive to the integrated circuit.

SUMMARY OF THE INVENTION

In accordance with the preferred embodiment of the present invention, a memory cell is presented. The memory cell includes a gated diode as a load element. In addition, the memory cell includes a selection means for selecting the memory cell.

For example, selection means includes a word line, a bit line, an inverted bit line, a ground line, a power line, a first transistor, a second transistor, a third transistor and a fourth transistor. The first transistor has a first end connected to the inverted bit line, a second end, and a gate connected to the word line. The second transistor has a first end, a second end connected to the bit line, and a gate connected to the word line. The third transistor has a first end connected to the second end of the first transistor, a second end connected to the ground line, and a gate connected to the first end of the second transistor. The fourth transistor has a first end connected to the first end of the second transistor, a second end connected to the ground line, and a gate connected to the second end of the first transistor.

In a first preferred embodiment of the present invention, the load element includes a first gated diode and a second gated diode. The first gated diode includes a first end connected to the power line, a second end connected to the second end of the first transistor, and a gate connected to the power line. The second gated diode includes a first end connected to the power line, a second end connected to the first end of the second transistor, and a gate connected to the power line.

The first end of the first gated diode includes a connection to a well of a first conductivity. The second end of the first gated diode includes a connection to a highly doped region of a second conductivity within the well. The gate of the gated diode includes a connection to a polysilicon gate region separated from the highly doped region and the well region by a layer of silicon dioxide (gate oxide).

In a second preferred embodiment of the present invention, the memory cell additionally includes a gate bias line. The first gated diode includes a first end connected to the power line, a second end connected to the second end of the first transistor, and a gate connected to the gate bias line. The second gated diode includes a first end connected to the power line, a second end connected to the first end of the second transistor, and a gate connected to the gate bias line.

The present invention has several advantages when compared to the prior art. For example, memory cells constructed in accordance with the preferred embodiments of the present invention are smaller than the standard six transistor cells. Further, the process required to construct memory cells in accordance with the preferred embodiments of the present invention is less complex than that required for a four transistor cell. In addition, memory cells in accordance with the preferred embodiments of the present invention are less susceptible to latch up than six transistor cells. The lesser sensitivity to latch up results because there is no direct connection of $V_{cc}$ to a heavily doped region of opposite polarity within a well.

Further, gate induced drain leakage (GIDL) current is used in memory cells constructed in accordance with the preferred embodiments of the present invention for "storing" or holding the state of the memory cell. Using GIDL current, the gated diodes perform as passive load elements. The GIDL current used in memory cells constructed in accordance with the preferred embodiments of the present invention is less sensitive to temperature variation than typical polysilicon load resistors used in a four transistor cell. This results in memory cells constructed in accordance with the preferred embodiments of the present invention having a lower standby current at high temperature than that of four transistor cells.

DESCRIPTION OF THE PREFERRED EMBODIMENT

Figure 1:
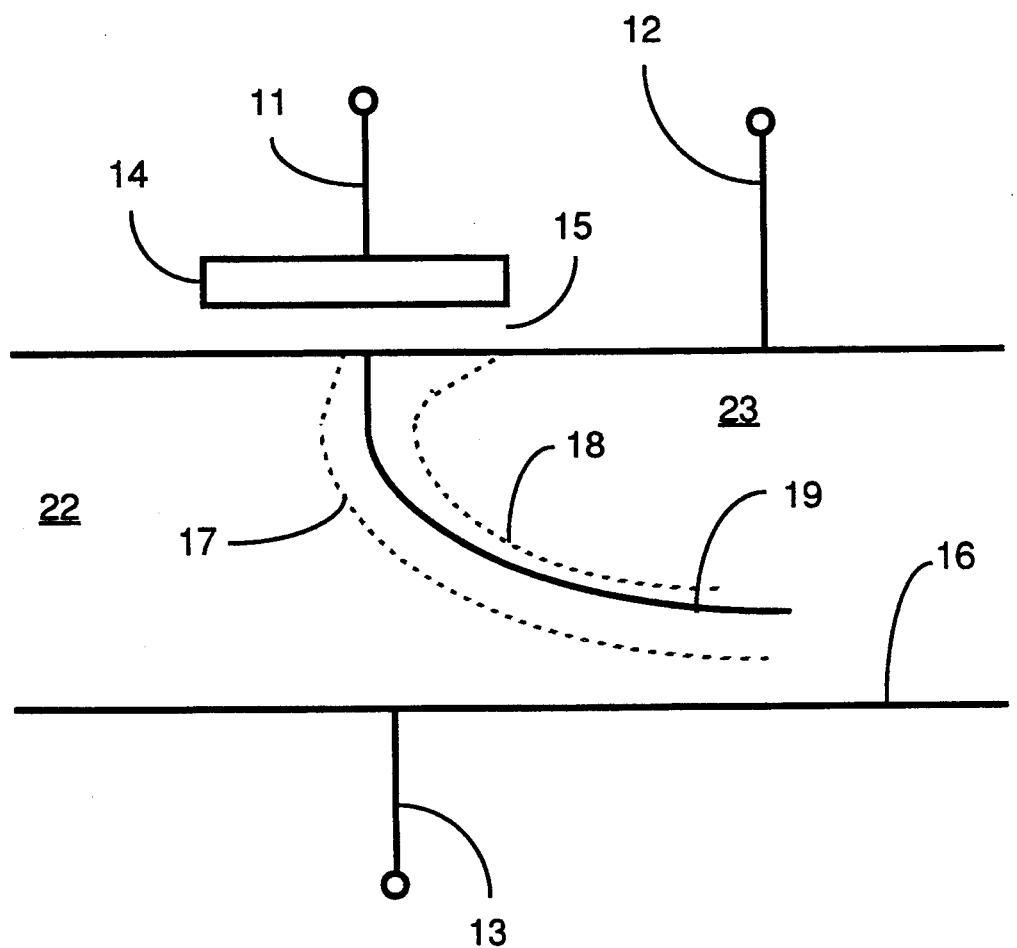
FIG. 1 shows a simplified cross section view of a gated diode load element in accordance with the preferred embodiment of the present invention.

FIG. 1 shows a simplified cross section view of a gated diode load element in accordance with the preferred embodiment of the present invention. The gated diode load element includes a gate electrode 11, a diode electrode 12 and a diode electrode 13. In a first embodiment of the present invention, gate electrode 11 and diode electrode 13 are electrically connected to a bias voltage $V_{cc}$. Diode electrode 13 is also connected to a well 22 of first conductivity type within the gated diode load element. The diode electrode 12 is connected to a diffused or implanted region 23 within well 22. Diffused or implanted region 23 is of second conductivity type. Gate electrode 11 is connected to a gate region 14. Gate region 14 is separated from well 22 and diffused or implanted region 23 by a silicon dioxide layer 15.

As the thickness of silicon dioxide layer 15 decreases, the gate induced drain leakage (GIDL) increases as a result of diode tunneling current from diode electrode 13 to diode electrode 12. This diode tunneling current is caused by severe band bending at the interface of silicon dioxide layer 15 and the surface of diffused or implanted region 23. For a discussion of GIDL, see T. Y. Chan, J. Chen, P. K. Ko and C. Hu, The Impact of Gate-Induced Drain Leakage Current on MOSFET Staling, *Digest of IEDM*, 1987, p. 718-721; and T. Endoh, R. Shirota, M. Moraodomi and F. Musuoka, An Accurate Model of Subbreakdown Due to Band-to-Band TunnelinK and Some Applications, *IEEE Transactions on Electron Devices*, Volume 37, Number 1, January 1990, p. 290-295.

As shown in FIG. 1, well 22 forms a junction 19 with diffused or implanted region 23. A depletion layer surrounding junction 19 extends from a depletion layer edge 17 to a depletion layer edge 18. As is illustrated by FIG. 1, there is an extension, or bending of depletion layer edge 18 as depletion layer edge 18 approaches the interface of gate oxide 15 and the surface of diffused or implanted region 23.

The band bending, and thus the leakage current of the diode, is a function of the junction doping profile, the doping of gate 14 (work function), the surface conditions (surface states), the thickness of silicon dioxide layer 15, the bias voltage placed on gate region 14 and the bias voltage from region 22 to region 23.

In the preferred embodiment of the present invention, the gate diode leakage is made sufficient to act as a load device for an SRAM memory cell. For example, for one embodiment of the present invention, well 22 is composed of n-type material with a surface concentration of atoms in the range of 8 times $10^{16}$ atoms per cubic centimeter. Diffused or implanted region 23 is, for example, composed of p+ material with a surface concentration of in the range of $10^{20}$ atoms per cubic centimeter. Gate region 14 is, for example, composed of polysilicon material doped n-type with a concentration of $10^{21}$ atoms per cubic centimeter. Silicon dioxide layer 15 is, for example, less than 90 Angstroms thick.

The leakage current for a gated diode load element with the parameters above is controllable by varying the bias voltage on gate region 14. For example, for a bias voltage of −4.0 volts on gate region 14 (with respect to region 23), leakage current through the gated diode load element is approximately 0.10 nanoamps. Likewise, for a bias voltage of −5.0 volts on gate region 14 (with respect to region 23), leakage current through the gated diode load element is approximately 10 nanoamps.

Using the gated diode load element shown in FIG. 1, it is possible to construct memory cells for SRAMs. For example, FIG. 2 and FIG. 3 show various SRAM cell configurations which utilize a gated diode load element in accordance with various preferred embodiments of the present invention.

Figure 2:
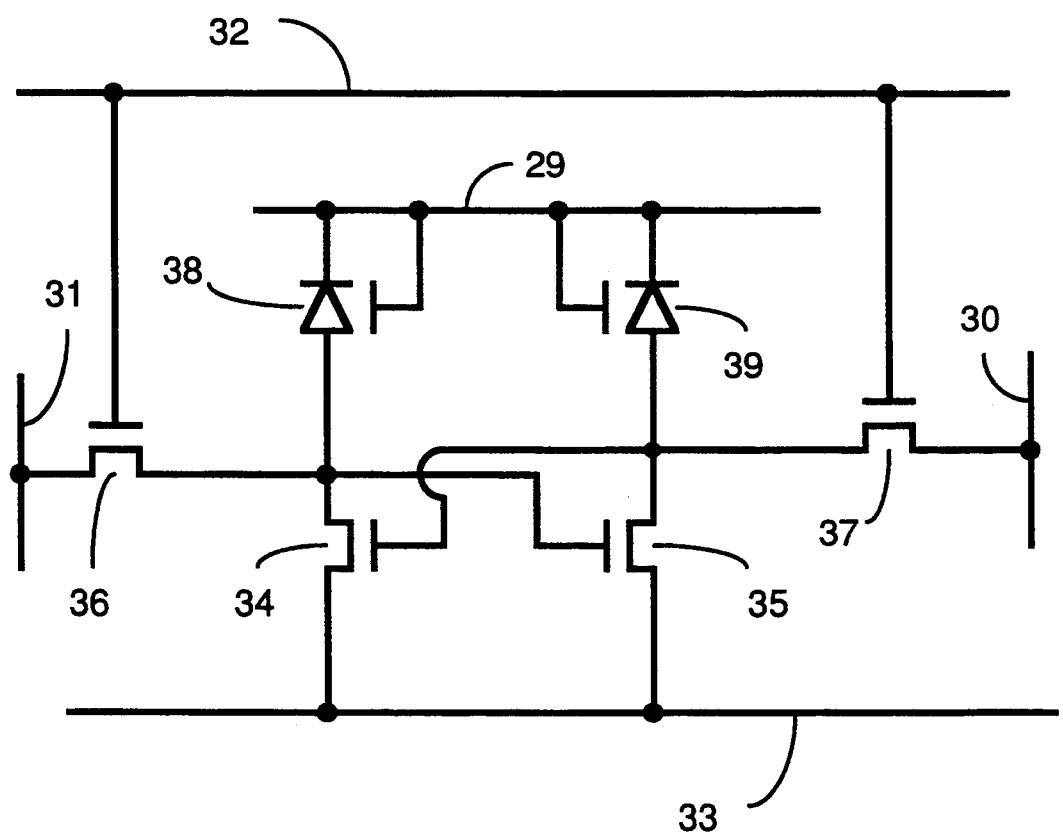
FIG. 2 shows an SRAM cell utilizing a gated diode load element in accordance with a preferred embodiment of the present invention.

FIG. 2 shows an SRAM cell according to a first preferred embodiment of the present invention. The SRAM cell includes a transistor 34, a transistor 35, a transistor 36 and a transistor 37 connected as shown. Transistor 34, transistor 35, transistor 36 and transistor 37 are each n-channel metal oxide silicon (NMOS) transistors. A gated diode load element 38 and a gated diode load element 39 are used as load devices for the SRAM memory cell. A $V_{cc}$ bias voltage is placed on a $V_{cc}$ bias voltage line 29. The $V_{cc}$ bias voltage is, for example, 5.0 volts. A $V_{ss}$ bias voltage is placed on a $V_{ss}$ bias voltage line 33. The $V_{ss}$ bias voltage is, for example 0 volts. The SRAM cell is accessed using a word line 32, a bit line 30 and an inverted bit line 31.

In the SRAM cell embodiment shown in FIG. 2, the gate of gated diode load element 38 and the gate of gated diode load element 39 are connected directly to $V_{cc}$ bias voltage on $V_{cc}$ bias voltage line 29. In this preferred embodiment, for gated diode load element 38 and gated diode load element 39, the connection to $V_{cc}$ bias voltage line 29 is within the SRAM cell, in order to reduce the cell size.

Figure 3:
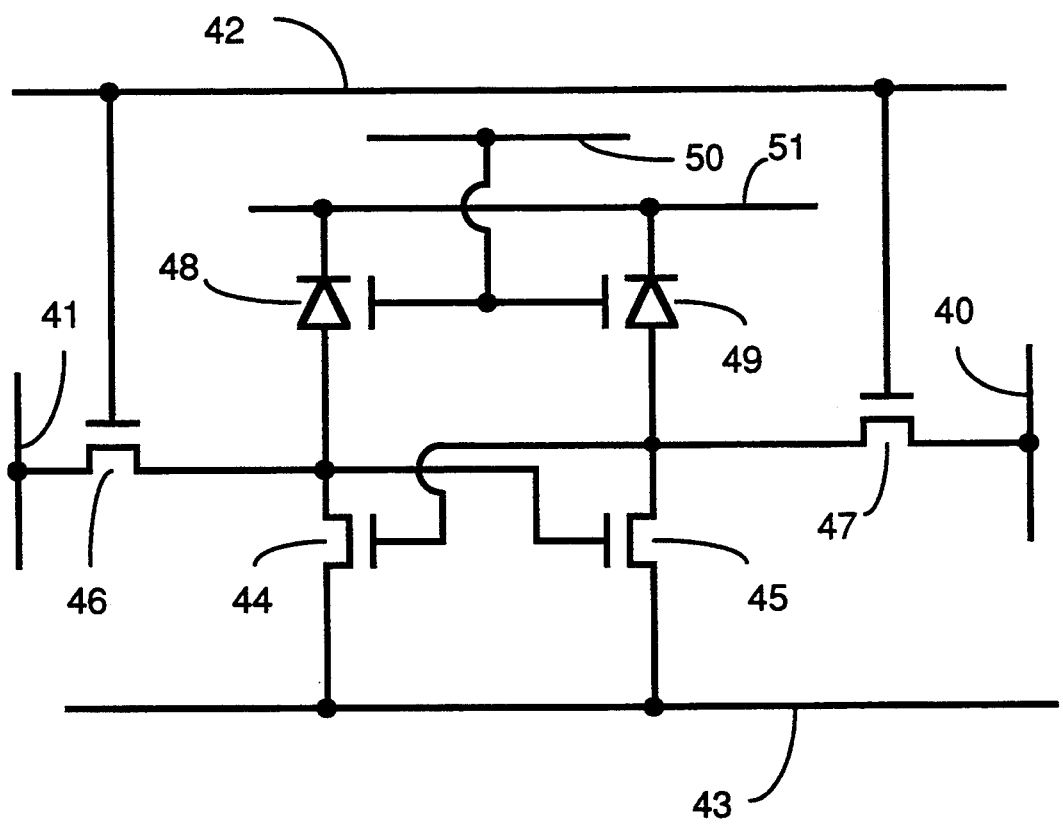
FIG. 3 shows an SRAM cell utilizing a gated diode load element in accordance with an alternate preferred embodiment of the present invention.

FIG. 3 shows an SRAM cell according to a second preferred embodiment. The SRAM cell includes a transistor 44, a transistor 45, a transistor 46 and a transistor 47 connected as shown. Transistor 44, transistor 45, transistor 46 and transistor 47 are each NMOS transistors. A gated diode load element 48 and a gated diode load element 49 are used as load devices for the SRAM memory cell. A $V_{cc}$ bias voltage is placed on a $V_{cc}$ bias voltage line 51. The $V_{cc}$ bias voltage is, for example, 5.0 volts. A $V_{ss}$ bias voltage is placed on a $V_{ss}$ bias voltage line 43. The $V_{ss}$ bias voltage is, for example 0 volts. The SRAM cell is accessed using a word line 42, a bit line 40 and an inverted bit line 41.

In the SRAM cell embodiment shown in FIG. 3, the gate of gated diode load element 48 and the gate of gated diode load element 49 are connected to a separate diode gate line 50. Diode gate line 50 runs parallel to word line 42 on the integrated circuit. The addition of diode gate line 50 allows gate bias voltage on the gates of gated diode load elements to be controlled by external circuitry. This allows for selection of a gate bias voltage which optimizes performance of the gated diode load elements and thus the SRAM cell.

In the configurations of SRAM cells shown in FIG. 2 and FIG. 3 above, the gated diode load elements act as passive loads. This results in a current flow in the SRAM cell even when the SRAM cell is quiescent. This current flow contributes to the overall standby current for each SRAM cell.

The foregoing discussion discloses and describes merely exemplary methods and embodiments of the present invention. As will be understood by those familiar with the art, the invention may be embodied in other specific forms without departing from the spirit or essential characteristics thereof. For example, in the discussion of the preferred embodiment, the SRAM cells utilized NMOS transistors and the gated diode load elements utilized a well region of n-conductivity type and a diffused or implanted region of p+ conductivity type. As will be understood by persons of ordinary skill in the art, the conductivity types could be changed to form SRAM cells still within the contemplated purview of the present invention. Accordingly, the disclosure of the present invention is intended to be illustrative, but not limiting, of the scope of the invention, which is set forth in the following claims.

I claim:

1. In an integrated circuit, a memory cell comprising:
a word line;
a bit line;
an inverted bit line;
a ground line;
a power line;
a first transistor having a first end coupled to the inverted bit line, a second end, and a gate coupled to the word line;
a second transistor having a first end, a second end coupled to the bit line, and a gate coupled to the word line;
a third transistor having a first end coupled to the second end of the first transistor, a second end coupled to the ground line, and a gate coupled to the first end of the second transistor;
a fourth transistor having a first end coupled to the first end of the second transistor, a second end coupled to the ground line, and a gate coupled to the second end of the first transistor;
a first diode comprising a first end coupled to the power line, and a second end coupled to the second end of the first transistor; and,
a second diode comprising a first end coupled to the power line, and a second end coupled to the first end of the second transistor.

2. A memory cell as in claim 1 wherein
the first diode additionally comprises a gate coupled to the power line; and,
the second diode additionally comprises a gate coupled to the power line.

3. A memory cell as in claim 2 wherein
the first end of the first gated diode comprises a connection to a well of a first conductivity;
the second end of the first gated diode comprises a connection to a highly doped region of a second conductivity within the well; and,
the gate of the first gated diode comprises a connection to a gate region separated from the highly doped region by a layer of gate oxide.

4. A memory cell as in claim 1 wherein
the memory cell additionally includes a gate bias line;
the first diode additionally comprises a gate coupled to the gate bias line; and,
the second diode additionally comprises a gate coupled to the gate bias line.

5. A memory cell as in claim 4 wherein
the first end of the first gated diode comprises a connection to a well of a first conductivity;
the second end of the first gated diode comprises a connection to a highly doped region of a second conductivity within the well; and,
the gate of the first gated diode comprises a connection to a gate region separated from the highly doped region by a layer of gate oxide.

6. A memory cell as in claim 1 wherein
the first end of the second transistor is coupled to the first end of the fourth transistor.

7. A memory cell as in claim 1 wherein
a first end of the first gated diode comprises a connection to a well of a first conductivity;
a second end of the first gated diode comprises a connection to a highly doped region of a second conductivity within the well; and,
a gate of the first gated diode comprises a connection to a gate region separated from the highly doped region by a layer of gate oxide.

8. In an integrated circuit, a memory cell comprising:
a first line held continuously at a first voltage;
a second line held continuously at a second voltage;
a load element including
a first gated diode having a first end and a second end, the first end being connected to the first line, and
a second gated diode having a first end and a second end, the first end being connected to the first line; and,
selection means, coupled to the second end of the first gated diode and the second end of the second gated diode, for selecting the memory cell;
wherein when the second end of the first gated diode is at the first voltage, a gate induced leakage current through the first gated diode holds the second end of the first gated diode at the first voltage, and when the second end of the second gated diode is at the first voltage, a gate induced leakage current through the second gated diode holds the second end of the second gated diode at the first voltage.

9. A memory cell as in claim 8 wherein the second voltage is a reference voltage and the first voltage is a power voltage.

10. A memory cell as in claim 9 wherein the selection means includes:
a word line;
a bit line;
an inverted bit line;
a first transistor having a first end coupled to the inverted bit line, a second end, and a gate coupled to the word line;
a second transistor having a first end, a second end coupled to the bit line, and a gate coupled to the word line;
a third transistor having a first end coupled to the second end of the first transistor, a second end coupled to the second line, and a gate coupled to the first end of the second transistor; and,
a fourth transistor having a first end coupled to the first end of the second transistor, a second end coupled to the second line, and a gate coupled to the second end of the first transistor.

11. A memory cell as in claim 10 wherein
the second end of the first gated diode is coupled to the second end of the first transistor, and a gate of the first gated diode is coupled to the first line; and,
the second end of the second gated diode is coupled to the first end of the second transistor, and a gate of the second gated diode is coupled to the first line.

12. A memory cell as in claim 11 wherein
the first end of the first gated diode comprises a connection to a well of a first conductivity;
the second end of the first gated diode comprises a connection to a highly doped region of a second conductivity within the well; and,
the gate of the first gated diode comprises a connection to a gate region separated from the highly doped region by a layer of gate oxide.

13. A memory cell as in claim 10 wherein
the memory cell additionally includes a gate bias line;
the first gated diode additionally includes a gate coupled to the gate bias line;
the second gated diode additionally includes a gate coupled to the gate bias line;
the second end of the first gated diode is coupled to the second end of the first transistor; and
the second end of the second gated diode is coupled to the first end of the second transistor.

14. A memory cell as in claim 13 wherein
the first end of the first gated diode comprises a connection to a well of a first conductivity;
the second end of the first gated diode comprises a connection to a highly doped region of a second conductivity within the well; and,
the gate of the first gated diode comprises a connection to a gate region separated from the highly doped region by a layer of gate oxide.

15. A memory cell as in claim 10 wherein
the first end of the second transistor is coupled to the first end of the fourth transistor.

16. A memory cell as in claim 8 wherein
the first end of the first gated diode comprises a connection to a well of a first conductivity;
the second end of the first gated diode comprises a connection to a highly doped region of a second conductivity within the well; and,
a gate of the first gated diode comprises a connection to a gate region separated from the highly doped region by a layer of gate oxide.

* * * * *